(12) United States Patent
Paaske et al.

(10) Patent No.: US 9,081,556 B2
(45) Date of Patent: Jul. 14, 2015

(54) POWER ON RESET DETECTOR

(75) Inventors: Timothy R. Paaske, Cupertino, CA (US); Erik P. Machnicki, San Jose, CA (US)

(73) Assignee: Apple Inc., Cupertino, CA (US)

( * ) Notice: Subject to any disclaimer, the term of this patent is extended or adjusted under 35 U.S.C. 154(b) by 585 days.

(21) Appl. No.: 13/533,285

(22) Filed: Jun. 26, 2012

(65) Prior Publication Data
US 2013/0342246 A1 Dec. 26, 2013

(51) Int. Cl.
*H03L 7/00* (2006.01)
*G06F 1/24* (2006.01)
*H03K 17/22* (2006.01)

(52) U.S. Cl.
CPC . *G06F 1/24* (2013.01); *H03K 17/22* (2013.01)

(58) Field of Classification Search
CPC .................................................. H03K 17/223
USPC ......................................................... 327/142
See application file for complete search history.

(56) References Cited

U.S. PATENT DOCUMENTS

| 7,348,815 | B2 | 3/2008 | Chou |
| 7,400,179 | B2 | 7/2008 | Lin |
| 7,965,113 | B2 * | 6/2011 | Fuller ........................... 327/142 |
| 2011/0210770 | A1 | 9/2011 | Fuller |
| 2011/0241741 | A1 | 10/2011 | Millendorf et al. |

* cited by examiner

*Primary Examiner* — Daniel Puentes
(74) *Attorney, Agent, or Firm* — Meyertons, Hood, Kivlin, Kowert & Goetzel, P.C.; Lawrence J. Merkel

(57) ABSTRACT

In an embodiment, an integrated circuit such may require that a full reset of the integrated circuit occur before the integrated circuit enters either a test mode or a functional mode. The integrated circuit may include a reset detector to detect that the reset has occurred, and the integrated circuit may not progress to the test mode or the functional mode unless the reset detector detects that the reset has occurred. Accordingly, if test mode is being entered, any user data that may have been stored in the integrated circuit during a preceding functional mode may have been cleared via the reset. Similarly, if normal mode is being entered, any test data that may have been stored in the integrated circuit in a preceding test mode may have been cleared via the reset.

21 Claims, 3 Drawing Sheets

POWER ON RESET DETECTOR

BACKGROUND

1. Field of the Invention

This invention is related to the field of integrated circuits and, more particularly, to detection of power on reset in an integrated circuit.

2. Description of the Related Art

Integrated circuits continue to increase in complexity and the number of high level component functions that are included in the integrated circuit also continues to increase. The system on a chip (SOC) is an example of the high level of integration, including one or more processors and various peripheral components, memory controllers, peripheral interface controllers, etc. on a single integrated circuit "chip." To ensure that the integrated circuits have been manufactured correctly, and to support debugging of hardware and software (which is complicated by the high level of integration), the integrated circuits typically support test modes in addition to the normal functional operation mode. The test modes may permit state to be scanned into and out of the integrated circuit.

The highly integrated circuits, such as SOCs, may be used in various devices that carry a user's personal data. For example, the integrated circuits may be used in smart phones, personal digital assistants, and other computing devices that a user may incorporate into his/her daily life and thus may carry significant amounts of personal data such as account numbers, passwords, and other personally-identifiable information. Similarly, such devices are increasingly being expected to maintain the digital rights of intellectual property owners (e.g. owners of audio and video data that a user is permitted to enjoy but is not permitted to copy or redistribute). Accordingly, the integrated circuits need to be secure for such data. Integrated circuits that can switch between test mode and normal functional mode may have potential insecurity (or may have a so-called "security hole") if data from the functional mode is accessible in test mode or vice-versa.

SUMMARY

In an embodiment, an integrated circuit such may require that a full reset of the integrated circuit occur before the integrated circuit enters either a test mode or a functional mode. The integrated circuit may include a reset detector to detect that the reset has occurred, and the integrated circuit may not transition to the test mode or the functional mode unless the reset detector detects that the reset has occurred. Accordingly, if test mode is being entered, any user data or other private data that may have been stored in the integrated circuit during a preceding functional mode may have been cleared via the reset. Similarly, if functional mode is being entered, any test data that may have been stored in the integrated circuit in a preceding test mode may have been cleared via the reset. The reset may be referred to as a "power on reset," or POR, because the reset may ensure a clean, empty state of the integrated circuit similar to a state that might be generated by resetting the integrated circuit at the time of power on.

In one embodiment, the reset detector may include a set of flops that are reset to a known state. If the reset has not occurred, the flops may have a random state that they acquired at power up. The random state may have a low probability of matching the known state. For example, if there are N flops (N is an integer), the probability that the random state matches the known state may be 1 in at least $2^N$.

BRIEF DESCRIPTION OF THE DRAWINGS

The following detailed description makes reference to the accompanying drawings, which are now briefly described.

Figure 1:
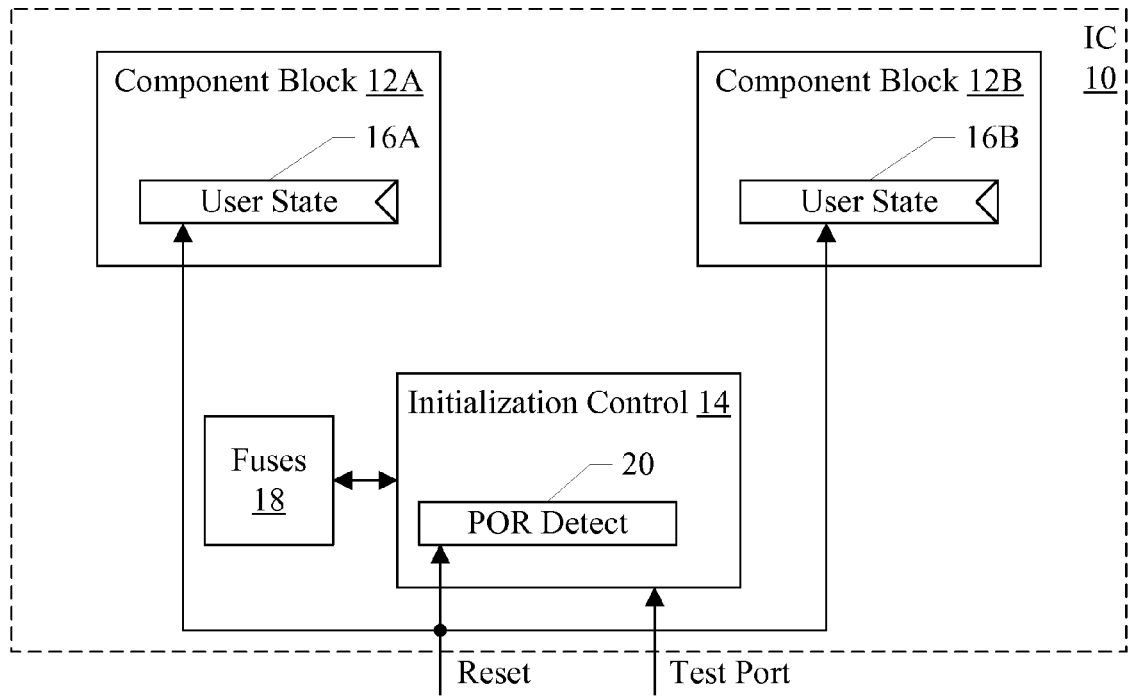
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits that implement the operation. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit (IC) 10 is shown. In the illustrated embodiment, the IC 10 includes one or more component blocks 12A-12B, an initialization control circuit 14, and a set of fuses 18. The component blocks 12A-12B may include various clocked storage devices 16A-16B (e.g. registers, flops, latches, etc.), some of which may store user state corresponding to a user of a system that includes the IC 10 (or other private state, such as unencrypted video, keys for video, keys for other encryption, etc.). The clocked storage devices 16A-16B may be coupled to receive a reset input to the IC 10. The initialization control circuit 14 may include a POR detect circuit 20 that is coupled to receive the reset input as well. The initialization control circuit 14 is coupled to the fuses 18 and a test port input to the IC 10.

As mentioned above, various storage devices 16A-16B may store user state or other private state during normal functional operation. To prevent such state from being available in test mode, which may permit the user/private state to be scanned out of the IC 10 or to otherwise be accessed from the IC 10, potentially for nefarious purposes, the initialization control circuit 14 may prevent entry into test mode unless a reset has been detected by the POR detector 20. Similarly, in an embodiment, the initialization control circuit 14 may prevent entry into normal functional mode (i.e. non-test) mode unless a reset has been detected by the POR detector 20. Generally, a test mode may be a mode in which the state of the IC 10 is accessible to a test controller (e.g. via the test port on the IC 10). The state may be scanned out for analysis, or scanned in to test the circuitry in the IC 10. The test port may be any type of test connection (e.g. the test port may be compatible with the joint test access group (JTAG) specification, Institute of Electrical and Electronic Engineers (IEEE) 1149.1 and follow-ons, or any other test port specification). The normal functional mode (or simply functional mode) may be a mode in which the IC 10 operates within the system to perform the operations that the system is designed for (e.g. computing, communication, etc.).

The POR detector 20 may include circuitry to detect that the reset has been performed. For example, in one embodiment, the POR detector 20 may include multiple storage devices that are coupled to the reset input. Each storage device may have a predefined reset state that the storage device acquires in response to assertion of the reset. Some of the storage devices may reset to a binary one, and others may reset to a binary zero. If IC 10 is powered up and the reset is not asserted, the storage devices may acquire a random state of either one or zero. Accordingly, by examining the state of the storage devices, the POR detector 20 may determine (which reasonable accuracy) whether or not a reset has been performed. For example, if there are N storage devices (where N is a positive integer) and if the storage devices are equally likely to have a one or a zero state in response to no reset, the odds of each storage device having the predefined state (and thus detecting a reset when no reset has occurred) is 1 in $2^N$. The probability may be further improved by altering the design of the storage devices so that the "non-reset" state is more likely to occur than the predefined reset state if the reset is not asserted. For example, if cross coupled inverters are used to form the storage device, the N-type metal-oxide-semiconductor (NMOS) transistor in one inverter and the P-type MOS (PMOS) transistor in the other inverter may be made larger than the remaining two transistors to make it likely that a binary one will appear on the output of the inverter having the larger PMOS transistor. The predefined reset state may include having a binary zero on the output of that inverter. In such a case, the probability of N storage devices having states that indicate a reset when no reset has occurred may be less probable than 1 in $2^N$.

The initialization control circuit 14 may be coupled to the fuses 18. The fuses 18 may be selectively blown at manufacture of the IC 10, to provide some instance-specific values (e.g. a private key or keys for the instance, a serial number or other instance identifier, permissible voltage and/or frequency combinations based on characterization testing, etc.). A fuse may also be used to indicate whether or not entry into test mode is permitted. That is, the fuse may have a first state (e.g. corresponding to a binary one) indicating that entry into the test mode is permitted and a second state different from the first state (e.g. corresponding to a binary zero) indicating that entry into the test mode is not permitted. The initialization control circuit 14 may be configured to read the fuses in response to detection of a reset by the POR detector 20, and may initialize various state within the IC 10 based on the fuses.

The component blocks 12A-12B may implement the operations for which the IC 10 is designed. For example, if the IC 10 includes processors, one or more of the component blocks 12A-12B may be processors. In an SOC implementation, one or more component blocks 12A-12B may include one or more memory controllers to communicate with a memory system (e.g. one or more dynamic random access memories). An SOC implementation may further include peripheral components such as audio and/or video processing components, graphics processing components, image processing components, networking components, peripheral interface controllers such as universal serial bus (USB), peripheral component interconnect (PCI), PCI express (PCIe), parallel or serial ports, universal asynchronous receiver/transceiver (UARTs), etc.

The test port and the reset input may be external inputs to the IC 10. That is, the test port may be connected to one or more pins on the package of the IC 10, which may be electrically connected to pads on the IC 10 itself. Similarly, the reset input may be received on an input pin of the package. In some cases, an internal reset may be supported (e.g. via a register written by software to cause a reset). The internal reset and the external reset may be logically combined to form the reset input to the POR detector 20 and the storage devices 16A-16B. Alternatively, the internal reset may be treated differently than the external reset (e.g. it may be a "soft" reset that resets selected storage devices).

Figure 2:
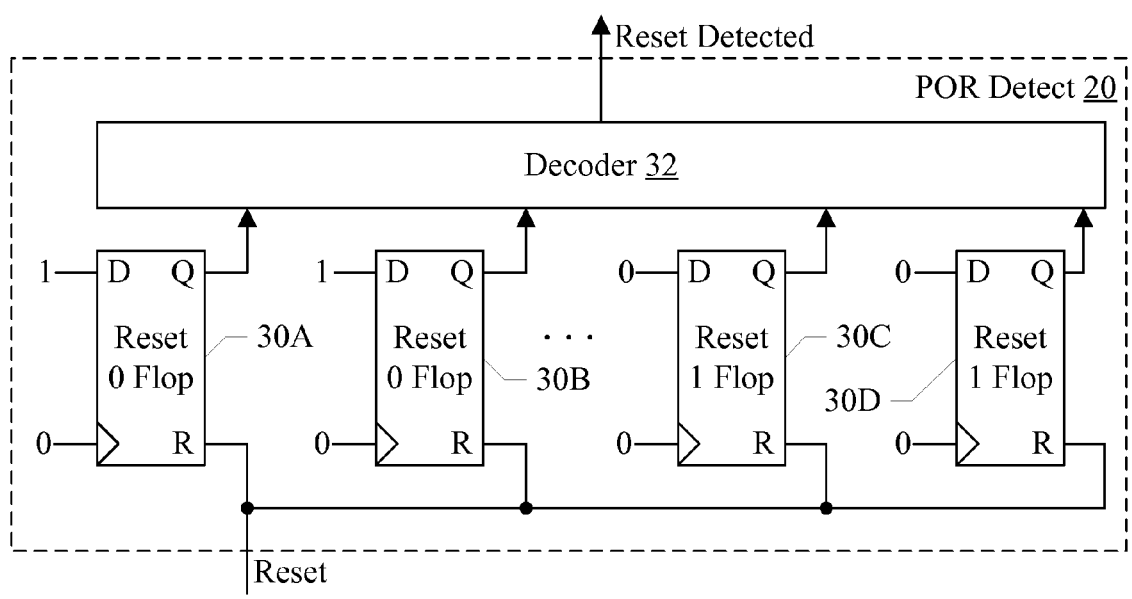
FIG. 2 is a block diagram of one embodiment of a reset detector.

FIG. 2 is a block diagram of one embodiment of the POR detect unit 20 is shown. In the illustrated embodiment, the POR detect unit 20 includes a set of flops including flops 30A-30D coupled to a decoder circuit 32. The decoder circuit 32 is configured to output a reset detected signal, and the flops 30A-30D are coupled to receive the reset signal on reset ports of the flops 30A-30D.

The flops 30A-30D may be representative of a set of flops that may be included in the POR detect circuit 20. There may be more flops than the flops 30A-30D. For example, a set of 32, 64, or 128 flops may be used. Some of the flops are reset to zero (e.g. the flops 30A-30B) and others are reset to one (e.g. the flops 30C-30D). In an embodiment, half of the flops may be reset to zero and the remaining half may be reset to one.

The decoder circuit 32 may be coupled to receive the state of each flop, and may be configured to decode the state based on the predefined reset state. For example, the decoder circuit 32 may logically NOR the states of the flops 30A-30B that are reset to zero, logically AND the states of the flops 30C-30D that are reset to one, and logically AND the result to generate the reset detected signal. Any Boolean equivalent of the above logic may be implemented in various embodiments of the decoder circuit 32.

Viewed in another way, the expected reset states of the flops 30A-30D may be viewed as a multibit value, and the decoder circuit 32 may decode the multibit value to generate the reset detected signal. In general, the decoder circuit 32 may be a control circuit configured to assert the reset detected signal responsive to the predetermined reset state appearing in the flops 30A-30D.

In the embodiment of FIG. 2, the flops 30A-30D may be D-type flops. D-flops have a data input (D), and capture the data input responsive to a clock input. The data input is output from the flop as well (Q). In the embodiment of FIG. 2, some of the D-flops are reset to zero flops (e.g. the flops 30A-30B), which are designed to reset to a binary zero on the Q output responsive to the assertion of the reset. Similarly, other D-flops are reset to one flops (e.g. the flops 30C-30D), which are designed to reset to a binary one on the Q output responsive to the assertion of the reset. The flops 30A-30D have a reset port (R) coupled to the reset input and the flops are configured to reset to zero or one (as appropriate) in response to assertion of the reset on the reset input.

In the embodiment of FIG. 2, the clock input to the flops 30A-30D is tied to a constant value. The constant value may be selected to ensure that the flops 30A-30D do not capture the D input, since the flops 30A-30D are provided to detect the reset. In the illustrated embodiment, the clock input is tied to zero. The D flops 30A-30D may be rising edge-triggered flops, for example, and a clock input of zero prevents a rising edge.

Additionally in FIG. 2, the D inputs of the flops 30A-30D are illustrated as being tied to a constant that is the opposite of the reset state. That is, the reset to zero flops 30A-30B have the D inputs tied to one, and the reset to one flops 30C-30D have their D inputs tied to zero. In this fashion, if the D inputs have some effect on the flops 30A-30D, the effect may be to change the state to the opposite (or logical complement) of the reset state.

Figure 3:
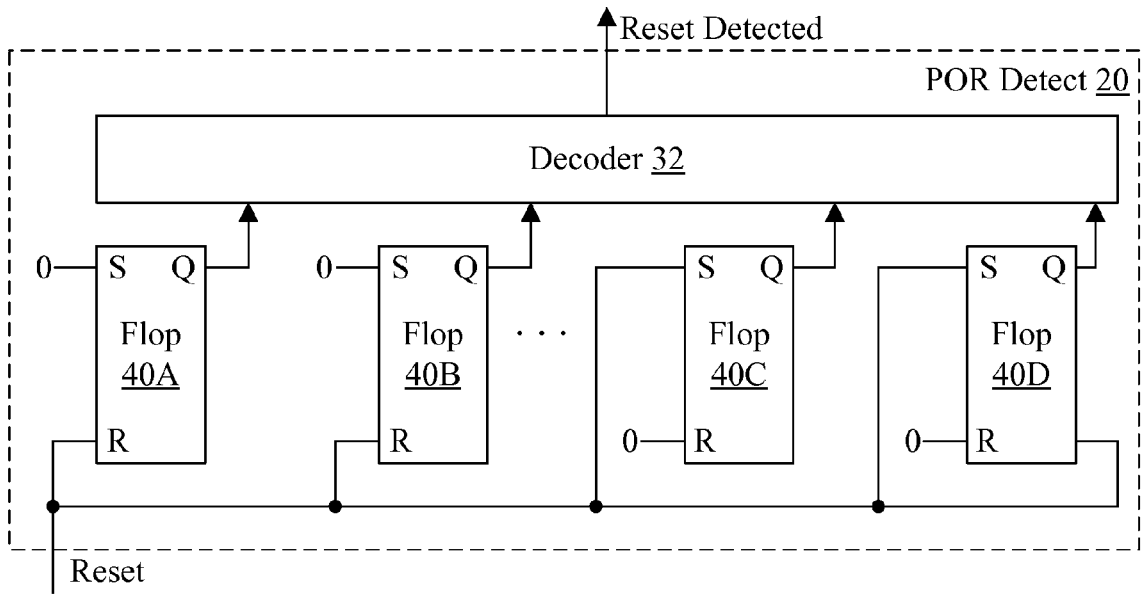
FIG. 3 is a block diagram of another embodiment of a reset detector.

FIG. 3 is a block diagram illustrating another embodiment of the POR detector 20. The embodiment of FIG. 3 includes the decoder 32 and a set of set-reset (S-R) flops 40A-40D in place of the flops 30A-30D. The flops 40A-40D may be representative of a set of flops that may be included in the POR detect circuit 20. There may be more flops than the flops 40A-40D. For example, a set of 32, 64, or 128 flops may be used. Some of the flops have a set port (S) coupled to receive the reset input (e.g. the flops 40C-40D), while others have a reset port (R) coupled to receive the reset input (e.g. the flops 40A-40B). Flops having the set port coupled to receive the reset input are set (binary one) on their Q outputs in response to an assertion of reset. Flops having the reset port coupled to receive the reset input are reset (binary zero) on their Q outputs in response to an assertion of reset. In an embodiment, half of the S-R flops 40A-40D may have the reset input coupled to the set port of the flops, and the other half of the S-R flops 40A-40D may have the reset port coupled to the reset input.

The embodiments of FIGS. 2 and 3 are merely examples. Other embodiments may use any type of flop or any type of storage device for the POR detector 20.

Figure 4:
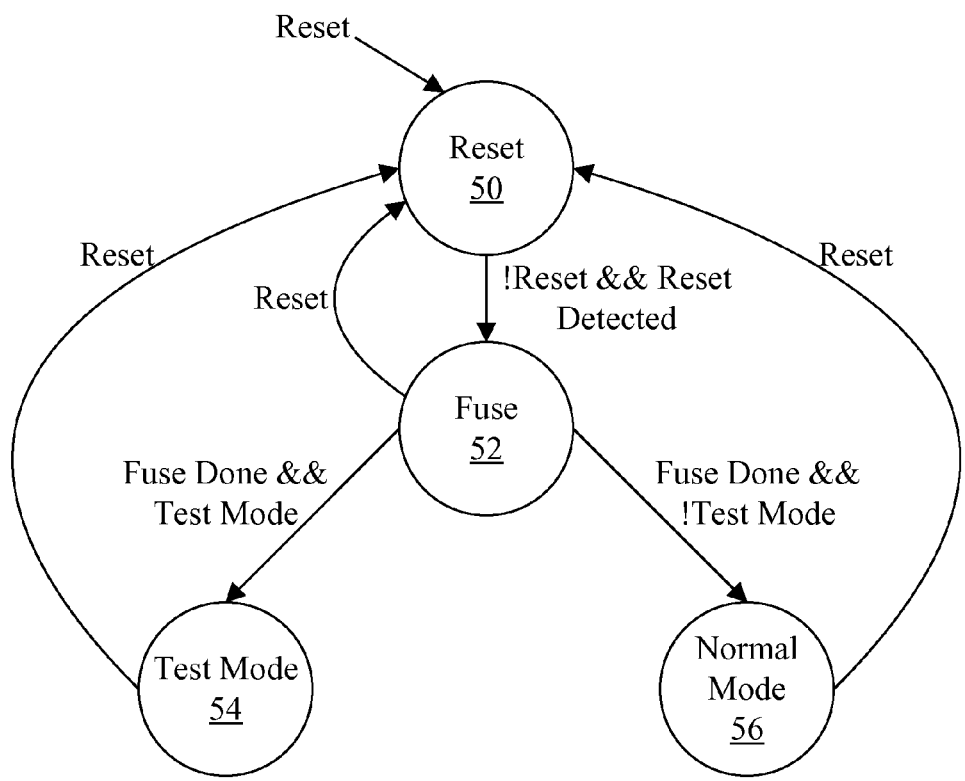
FIG. 4 is a block diagram of one embodiment of a state machine for an initialization control unit shown in FIG. 1.

FIG. 4 is a state machine that may be implemented by one embodiment of the initialization control circuit 14. Generally, the state machine may remain in a particular state unless the conditions for a state transition from that state to another state (as shown in FIG. 4) are met. In the illustrated embodiment, the state machine includes a reset state 50, a fuse state 52, a test mode state 54, and a normal functional mode state 56.

In response to a reset assertion while in any state (e.g. the test mode state 54, the normal functional mode state 56, the fuse state 52, or any other state), the state machine transitions to the reset state 50. The state machine may remain in the reset state 50 until the reset is deasserted and the reset detected output from the POR detector 20 is asserted. The state machine may then transition to the fuse state 52, during which the initialization control circuit 14 may be configured to read the fuses 18. Reading the fuses may include reading private or secure state, such as instance-specific keys or other values. Accordingly, preventing entry into the fuse state 62 may prevent reading of private or secure data until a POR has been detected. Once the fuse read (and corresponding initialization in the IC 10) is complete, the state machine may transition from the fuse state 52 to one of the test mode state 54 or the normal (functional) mode state 56. In the test mode state 54, test access to the component blocks 12A-12B may be permitted from the test port. In the normal functional mode state 56, test access is not permitted and the IC 10 (component blocks 12A-12B) operates in functional mode. The state machine may transition to the test mode state 54 from the fuse state 52 if the fuse read is complete and the test mode is selected. The test mode selection may be controlled by requests from the test port and/or from a fuse that indicates whether test mode entry is permitted. That is, test mode may be selected, e.g., if the fuse is in the first state and communication on the test port has been received requesting test mode. The normal functional mode may be selected, e.g., if the fuse is in the second state or no communication on the test port has been received requesting the test mode. If test mode is not selected and the fuse read is complete, the state machine may transition to the normal mode state 56 from the fuse state 52.

As can be seen in FIG. 4, once the test mode state 54 has been entered, it is not possible to enter the normal functional mode state 56 without detection of at least one reset by the POR circuit 20 since the integrated circuit 10 has been powered up. Similarly, once the normal functional mode 56 has been entered, it is not possible to enter the test mode state 54 without detection of at least one reset by the POR circuit 20 since the integrated circuit 10 has been powered up. Even though the reset state 50 is entered in response to assertion of reset, exiting the reset state 50 includes detecting that the reset has occurred (i.e. that the reset remained asserted long enough to actually reset the storage devices).

Figure 5:
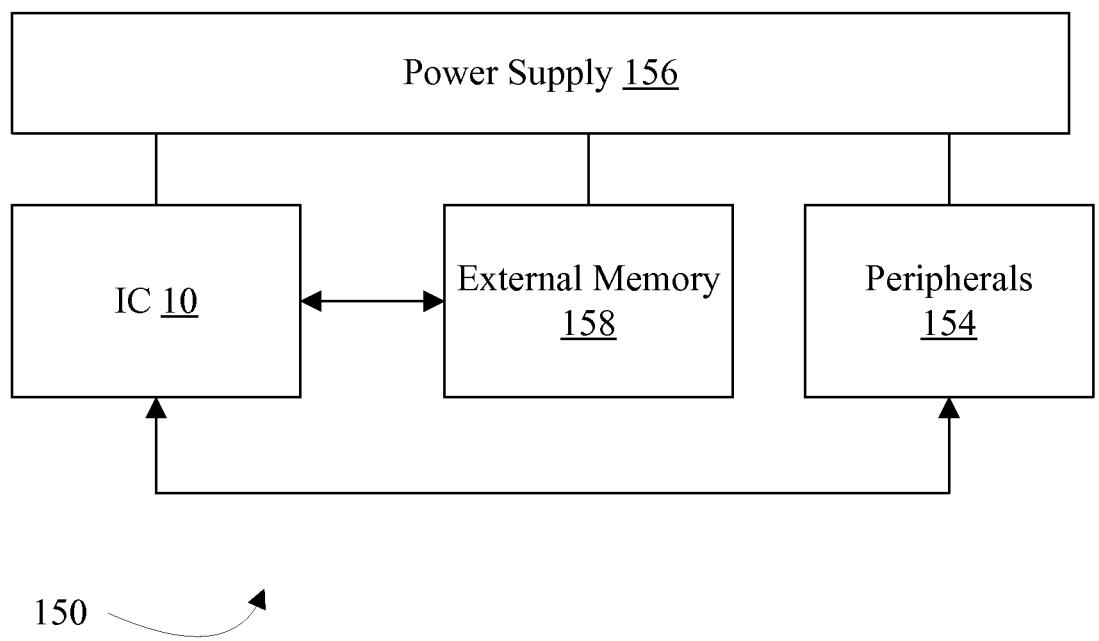
FIG. 5 is a block diagram of one embodiment of a system including the integrated circuit of FIG. 1.

Turning now to FIG. 5, a block diagram of one embodiment of a system 150 is shown. In the illustrated embodiment, the system 150 includes at least one instance of the integrated circuit 10 (from FIG. 1) coupled to one or more peripherals 154 and an external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc. Alternatively, the external memory 158 may include one or more memory devices that are mounted on the integrated circuit 10 in a chip-on-chip or package-on-package implementation.

Numerous variations and modifications will become apparent to those skilled in the art once the above disclosure is fully appreciated. It is intended that the following claims be interpreted to embrace all such variations and modifications.

What is claimed is:

1. An apparatus comprising:
a plurality of storage devices, each storage device having a predetermined reset state that the storage device is configured to acquire in response to a reset on a reset input; and
a circuit coupled to the plurality of storage devices and configured to operate on current states of the plurality of storage devices, wherein the circuit is configured to detect that the reset has not been performed responsive to one or more of the current states in the plurality of storage devices not matching the corresponding predetermined reset states, and wherein the circuit is configured to prevent entry into both a functional mode and a test mode unless the reset has been performed as detected from the plurality of storage devices, and wherein the circuit is configured to permit a read of a plurality of fuses responsive to detecting the predetermined reset states.

2. The apparatus as recited in claim 1 wherein the plurality of storage devices are flops.

3. The apparatus as recited in claim 2 wherein the plurality of storage devices are D flops having a reset port coupled to the reset input.

4. The apparatus as recited in claim 2 wherein the plurality of storage devices are set-reset (S-R) flops, and wherein the reset input is coupled to a set port of a subset of the S-R flops, and wherein the reset input is coupled to a reset port of remaining ones of the S-R flops that are not in the subset.

5. The apparatus as recited in claim 1 at least one of the plurality of storage devices has a binary one as the predetermined reset state and at least one other one of the storage devices has a binary zero as the predetermined reset state.

6. The apparatus as recited in claim 1 wherein the plurality of storage devices are designed to bias toward an opposite state of the predetermined reset state when powered up and the reset is not asserted.

7. A method comprising:
powering up an integrated circuit;
a reset detector in the integrated circuit detecting whether or not a reset input to the integrated circuit is asserted to cause a reset of the integrated circuit, wherein the reset detector comprises a plurality of storage devices that are configured to reset to predefined reset states in response to a reset, and wherein detecting whether or not the reset input has been asserted comprises detecting whether or not the plurality of storage devices have the predefined reset states;
an initialization control circuit preventing a transition of the integrated circuit into a test mode in response to the reset detector detecting no reset;
the initialization control circuit preventing a transition of the integrated circuit into a functional mode in response to the reset detector detecting no reset and
the initialization control circuit accessing a plurality of fuses responsive to the reset detector detecting the predefined reset states.

8. The method as recited in claim 7 further comprising:
the reset detector detecting that the reset input is asserted; and
the initialization control circuit permitting the transition to either the test mode or the functional mode responsive to the reset detector detecting the reset assertion.

9. The method as recited in claim 8 wherein the initialization control circuit permitting the transition comprises the initialization control circuit permitting the transition to the test mode responsive to communication on a test port to which the initialization control circuit is coupled selecting the test mode.

10. The method as recited in claim 9 wherein the initialization control circuit permitting the transition comprises the initialization control circuit permitting the transition to the functional mode responsive to a lack of communication on the test port.

11. An integrated circuit comprising:
one or more component blocks coupled to receive a reset input and configured to reset responsive to the reset input; and
a control unit including a reset detector coupled to receive the reset input, wherein the reset detector comprises a plurality of flops, wherein the plurality of flops are configured to reset to a predetermined reset value responsive to the assertion of a reset on the reset input, and wherein the control unit is configured to prevent the transition of the integrated circuit into both a functional mode and a test mode unless the reset detector detects the predetermined reset value in the plurality of flops, and wherein the control unit is configured to permit a read of a plurality of on-chip fuses responsive to the reset detector detecting the predetermined reset value.

12. The integrated circuit as recited in claim 11 wherein the reset value comprises a plurality of binary ones and a plurality of binary zeros.

13. The integrated circuit as recited in claim 12 wherein one half of the plurality of flops reset to binary one and another half of the plurality of flops reset to a binary zero.

14. The integrated circuit as recited in claim 13 the plurality of flops are set-reset (S-R) flops, and wherein the half of plurality of flops that are reset to a binary one have a set port coupled to the reset input, and wherein the other half of the plurality of flops have a reset port coupled to the reset input.

15. The integrated circuit as recited in claim 11 wherein only a transition to the functional mode is permitted responsive to a first fuse of the plurality of fuses having a first state.

16. The integrated circuit as recited in claim 15 wherein a transition to either the functional mode or the test mode is permitted responsive to the first fuse having a second state different from the first state.

17. The integrated circuit as recited in claim 16 wherein selection of the functional mode or the test mode is controlled responsive to communication on a test port to which the initialization control circuit is coupled.

18. An integrated circuit comprising:
a plurality of component blocks that implement the operation of the integrated circuit in a functional mode, wherein the plurality of component block comprise storage devices that are configured to store at least some user state, wherein the plurality of component blocks are coupled to receive a reset and are configured to reset the storage devices responsive to an assertion of the reset, and wherein reset of the plurality of component blocks clears the user state in the storage devices;
an initialization control circuit including a reset detector coupled to receive the reset, wherein the reset detector comprises a plurality of flops, wherein the plurality of flops are configured to reset to a predetermined reset value responsive to the assertion of the reset, and wherein the initialization control circuit is configured to prevent operation of the plurality of component blocks until the reset detector detects the predetermined reset value in the plurality of flops; and a plurality of fuses, wherein the initialization control circuit is configured to access the plurality of fuses responsive to the reset detector detecting the predetermined value.

19. The integrated circuit as recited in claim 18 wherein the initialization control circuit is configured to operate the plurality of component blocks in one of a test mode or a functional mode responsive to a value from at least one of the plurality of fuses.

20. The integrated circuit as recited in claim 19 wherein the initialization control circuit is configured to operate the plurality of component blocks in the functional mode responsive to the value having a first binary state.

21. The integrated circuit as recited in claim 20 wherein the initialization control circuit is configured to operate the plurality of component blocks in either the functional mode or the test mode responsive to the value having a second binary state.

* * * * *